United States Patent [19]

Shoji et al.

[11] Patent Number: 4,607,174
[45] Date of Patent: Aug. 19, 1986

[54] VOLTAGE DETECTION CIRCUIT USING THRESHOLD AS REFERENCE VOLTAGE FOR DETECTING INPUT VOLTAGE

[75] Inventors: Masashi Shoji; Haruo Niki, both of Tokyo, Japan

[73] Assignee: Nippon Electric Co., Ltd., Tokyo, Japan

[21] Appl. No.: 460,712

[22] Filed: Jan. 24, 1983

[30] Foreign Application Priority Data

Jan. 22, 1982 [JP] Japan .................................. 57-8657

[51] Int. Cl.⁴ ......................................... H03K 5/153
[52] U.S. Cl. .................................... 307/363; 307/310; 307/296 R
[58] Field of Search ................... 307/296 R, 310, 362, 307/363, 350

[56] References Cited

U.S. PATENT DOCUMENTS 3,290,520 12/1966 Wennik .............................. 307/350
3,725,675 4/1973 Olsen ................................. 307/362

Primary Examiner—John Zazworsky
Attorney, Agent, or Firm—Sughrue, Mion, Zinn, Macpeak & Seas

[57] ABSTRACT

A voltage detection circuit for comparing an input voltage against a reference voltage, the reference voltage being derived from the threshold voltage of a semiconductor active device which forms a portion of the voltage detection circuit. To make the detection circuit substantially independent of ambient temperature changes, it is constructed as an integrated circuit and includes devices for producing a temperature dependent voltage equal to but of opposite sign to the temperature sensitive voltage component of the reference voltage. The two temperature sensitive voltages cancel each other to thereby permit a temperature independent voltage comparison.

5 Claims, 3 Drawing Figures

VOLTAGE DETECTION CIRCUIT USING THRESHOLD AS REFERENCE VOLTAGE FOR DETECTING INPUT VOLTAGE

BACKGROUND OF THE INVENTION

The present invention relates to a voltage detection circuit for detecting an input voltage having a predetermined level by comparing the input voltage with a reference voltage, and more particularly, to a voltage detection circuit using the threshold voltage of a semiconductor active element such as a transistor as the reference voltage.

In general, a comparison circuit is employed as a voltage detection circuit for detecting input voltage, and the comparison output from the comparison circuit is used as a voltage detection output. An input voltage to be detected is applied to one input terminal of the comparison circuit, while a reference voltage obtained by using the power supply voltage or a constant voltage element (e.g., a zener diode) is supplied to the other input terminal. Such a voltage detection circuit offers an advantage that the voltage level for detecting input voltage can be made to vary by adjusting the reference voltage. However, it is hard to maintain the predetermined value of the reference voltage which relies upon the power supply voltage or a constant voltage of a constant voltage element, when the power supply voltage transiently changes at the time of the turning on or off of the power, or when the power supply voltage is so low that it becomes impossible for the constant voltage element to maintain a fixed voltage.

Instead of using the reference voltage having the mentioned drawback, a threshold voltage of a semiconductor active element such as transistor may be employed as the reference voltage to be compared with the input voltage to be detected. The threshold voltage is such a voltage that the semiconductor active element is activated by a voltage higher than that. Since the threshold voltage is fixed and independent of the power supply voltage, the aforementioned problem ocurring when the power supply voltage is in a transient state can be eliminated. By attenuating the input voltage by means of a resistance-dividing circuit, adjusting the attenuation ratio of the dividing circuit and comparing the attenuated input voltage with the threshold voltage, it is possible to vary the voltage level for detecting the input voltage. However, although the threshold voltage is constant with respect to the power supply voltage, it has a temperature coefficient. In other words, the threshold voltage varies in response to changes in the ambient temperature. Consequently, the input voltage detection level varies with temperature, and it is impossible to expect a reliable detection operation.

SUMMARY OF THE INVENTION

It is, therefore, an object of the present invention to provide a voltage detection circuit using the threshold voltage wherein the effect of the temperature coefficient of the threshold voltage is diminished.

It is another object of the present invention to provide a voltage detection circuit having an arrangement suited to a semiconductor integrated circuit, wherein the variation in the input voltage detection level resulting from the ambient temperature change is reduced.

A voltage detection circuit in accordance with the present invention includes a circuit having a semiconductor active element, with a threshold voltage. This circuit is further provided with a voltage input terminal and an output terminal. An input voltage to be detected is supplied to the voltage input terminal. When the input voltage having a greater voltage amplitude than this threshold voltage is supplied to the voltage input terminal, the semiconductor active element is activated to produce a predetermined output signal at the output terminal. The threshold voltage at the aforementioned circuit comprises a first voltage component corresponding to the threshold of the semiconductor active element and a second voltage component having a temperature coefficient opposite to the temperature coefficient of the first voltage component.

Thus, the input voltage is supplied to the voltage input terminal of the circuit having a semiconductor active element, and compared with the threshold voltage. This threshold voltage is fixed irrespective of the state of the power supply voltage since it is not obtained by using the power supply voltage. Further, since the threshold voltage comprises the first voltage component corresponding to the threshold of the semiconductor active element and the second voltage component having a temperature coefficient opposite to the temperature coefficient of the first voltage component, the variation of the threshold voltage of the circuit; resulting from the ambient temperature change can be reduced. If the absolute values of the temperature coefficients of the first voltage component and the second voltage component are equalized, the threshold voltage becomes substantially fixed irrespective of the variations in the ambient temperature.

BRIEF DESCRIPTION OF THE DRAWINGS

Above and other objects, features and advantages of the present invention will be more apparent from the following description taken in connection with the accompanying drawings.

DETAILED DESCRIPTION OF THE PRIOR ART

Figure 1:
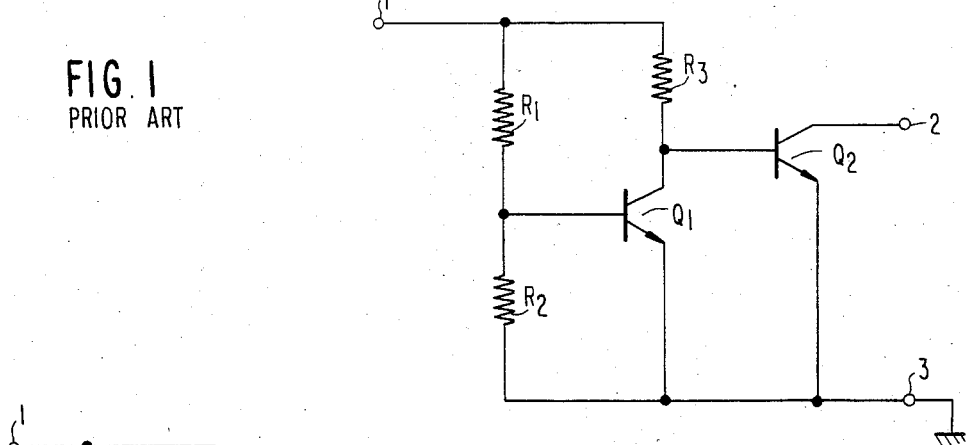
FIG. 1 is a circuit diagram illustrating a voltage detection circuit according to the prior art, which compares the input voltage with a voltage using the threshold voltage of a semiconductor active element.

Referring now to FIG. 1, a voltage detection circuit according to prior art will be described hereinafter. An input voltage to be detected is supplied between a detection terminal 1 and a reference potential terminal 3 (a ground terminal in FIG. 1). Resistors $R_1$ and $R_2$ are connected in series between the terminals 1 and 3. A base-emitter path of a transistor $Q_1$ is connected in parallel with the resistor $R_2$, and its collector is connected to the voltage input terminal 1 via a resistor $R_3$. The collector of the transistor $Q_1$ is further connected to the base of a transistor $Q_2$. The emitter of the transistor $Q_2$ is connected to the terminal 3, while its collector is connected to an output terminal 2.

When the base-emitter threshold voltage of the transistor $Q_1$ when turned on is taken as $V_{thQ_1}$, the threshold voltage $V_{thd}$ of the detection terminal 1 is expressed by the following formula:

$$V_{thd} = \left(1 + \frac{R_1}{R_2}\right) \cdot V_{thQ1} \tag{1}$$

When the voltage at the detection terminal 1, i.e., the input voltage $V_d$, is less than $V_{thd}$, the base-emitter voltage $V_{BEQ1}$ is less than the threshold voltage $V_{thQ1}$ ($V_{BEQ1} < V_{thQ1}$), so that the transistor $Q_1$ is cut off. Consequently, the transistor $Q_2$ is made to conduct, and the output terminal 2 takes a low level. When the voltage $V_d$ at the input terminal 1 is greater than or equal to $V_{thd}$ the base-emitter voltage $V_{BEQ1}$ becomes greater than the threshold voltage $V_{thQ1}$ ($V_{BEQ1} \geq V_{thQ1}$), so that the transistor $Q_1$ is made to conduct, while the transistor $Q_2$ is cut off. Consequently, the output terminal 2 is in an open condition. Thus, it is possible to detect the input voltage supplied to the detection terminal 1 by comparing it with the threshold voltage $V_{thd}$ of this circuit using the threshold $V_{thQ1}$ of the transistor $Q_1$. Since the threshold voltage $V_{thd}$ has a fixed level with respect to the power supply voltage, is evident from the formula (1), it is possible to attain a desired detection operation irrespective of the state of the power supply voltage.

In the prior art circuit shown in FIG. 1, however, there is a drawback that there are large temperature variations with respect to the threshold voltage $V_{thd}$ at the detection terminal 1. In other words, the temperature coefficient $\partial V_{thd}/\partial T$ of $V_{thd}$ is expressed from the formula (1):

$$\partial V_{thd}/\partial T = \left(1 + \frac{R_1}{R_2}\right) \cdot \partial V_{thQ1}/\partial T \tag{2}$$

Here, the temperature coefficient $\partial V_{thQ1}/\partial T$ of the base-emitter threshold voltage of the transistor $Q_1$ is approximately $-2$ mV/° K. Accordingly, the temperature coefficient $\partial V_{thd}/\partial T$ of the threshold voltage $V_{thd}$ the detection input terminal 1 takes a negative temperature coefficient, and its value takes a value of several mV/° K. As a specific example, if it is assumed that $R_1 = 16$ k$\Omega$, and $R_2 = 4$ k$\Omega$, then $\partial V_{thd}/\partial T = -10$ mV/° K.

DETAILED DESCRIPTION OF THE PREFERRED EMBODIMENTS

Figure 2:
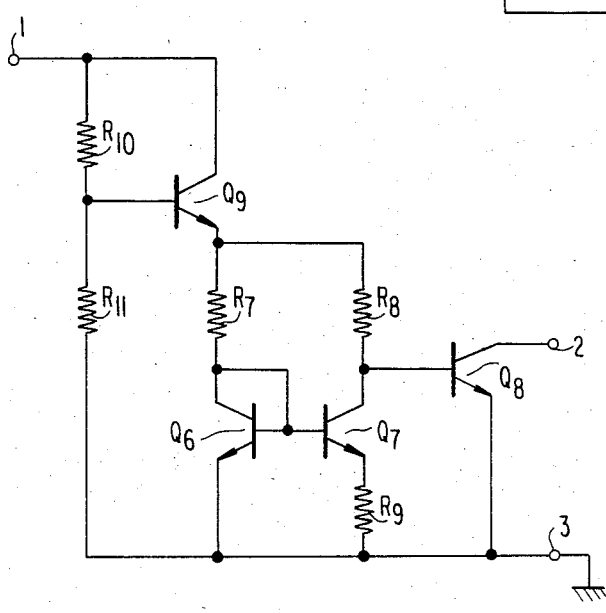
FIG. 2 is a circuit diagram of a voltage detection circuit in accordance with a preferred embodiment of the present invention.

Referring now to FIG. 2, a preferred embodiment of the present invention will be described hereinafter. The voltage to be detected is supplied between the voltage detection terminal (input terminal) 1 and the reference potential (GND) terminal 3. Resistors $R_{10}$ and $R_{11}$ are connected in series between the terminals 1 and 3. The base of a transistor $Q_9$ is connected to the junction between $R_{10}$ and $R_{11}$, and its collector is connected to the detection terminal 1. The emitter of the transistor $Q_9$ is connected to the terminal 3 via a resistor $R_7$ and a diode-connected transistor $Q_6$. The emitter of the transistor $Q_9$ is further connected to the collector of a transistor $Q_7$ via a resistor $R_8$, and the base of the transistor $Q_7$ is connected to the base of the transistor $Q_6$. The emitter of the transistor $Q_7$ is connected to the ground terminal 3 via a resistor $R_9$. The collector of the transistor $Q_7$ is connected to the base of a transistor $Q_8$, and its emitter is connected to the terminal 3. The collector of the transistor $Q_8$ is connected to an output terminal 2. This circuit is made in the form of a semiconductor integrated circuit, and therefore, each transistor operates at the same junction temperature. The threshold voltage $V_{thf}$ of the detection terminal 1 at the time when the transistor $Q_8$ is made to conduct is expressed by the following formula (3). Further the following formulas (4) through (10) hold with respect to the voltages and currents at each operating points.

$$V_{thf} = \left(1 + \frac{R_{10}}{R_{11}}\right) \times V_{BQ9} \tag{3}$$

$$V_{BQ9} = V_{BEQ9} + V_{EQ9} \tag{4}$$

$$V_{EQ9} = V_{thQ8} + I_{Q7} \times R_8 \tag{5}$$

$$V_{EQ9} = V_{BEQ6} + I_{Q6} \times R_7 \tag{6}$$

$$V_{BEQ6} = V_{BEQ7} + I_{Q7} \times R_9 \tag{7}$$

$$V_{BEQ6} = \frac{KT}{q} \ln \frac{I_{Q6}}{I_{SQ6}} \tag{8}$$

$$= \frac{KT}{q} \ln \frac{V_{EQ9} - V_{BEQ6}}{I_{SQ6} \cdot R_7}$$

$$V_{BEQ7} = \frac{KT}{q} \ln \frac{I_{Q7}}{I_{SQ7}} \tag{9}$$

$$= \frac{KT}{q} \ln \frac{V_{EQ9} - V_{BEQ8}}{I_{SQ7} \cdot R_8}$$

$$V_{thQ8} = \frac{KT}{q} \ln \frac{I_{Q8}}{I_{SQ8}} \tag{10}$$

where $V_{BQ9}$: base voltage of transistor $Q_9$;

$V_{EQ9}$: emitter voltage of transistor $Q_9$;

$V_{BEQ9}$, $V_{BEQ6}$, $V_{BEQ7}$: respective base-emitter voltages of transistors $Q_9$, $Q_6$, and $Q_7$;

$V_{thQ8}$ base-emitter threshold voltage at the time when transistor $Q_8$ becomes conductive;

$I_{SQ6}$, $I_{SQ7}$, $I_{SQ8}$: respective saturated currents of transistors $Q_6$, $Q_7$ and $Q_8$;

$I_{Q6}$, $I_{Q8}$ respective collector currents at transistors $Q_6$ and $Q_8$;

$I_{Q7}$: emitter current of transistor $Q_7$;

$R_7$, $R_8$, $R_9$, $R_{10}$, $R_{11}$ respective resistance values of resistors $R_7$, $R_8$, $R_9$, $R_{10}$, $R_{11}$;

q: electric charge of electrons;

K: Boltzmann's constant;

T: absolute temperature (° K.);

When the base-emitter junction area of the transistor $Q_7$ is a times as large as that of the transistor $Q_6$, the following formula holds:

$$I_{SQ7} = a \cdot I_{SQ6} \tag{11}$$

Using the formulas (8), (9) and (11) for the formula (7), $I_{Q7}$ is obtained by:

$$I_{Q7} = \frac{1}{R_9} \cdot \frac{KT}{q} \ln \frac{a \cdot R_8 (V_{EQ9} - V_{BEQ6})}{R_7 (V_{EQ9} - V_{thQ8})} \tag{12}$$

Since the operating point is selected in such a way that $V_{BEQ6}$ and $V_{thQ8}$ become substantially equal when the transistor $Q_8$ is made to conduct, the formula (12) can be expressed as follows:

$$I_{Q7} = \frac{1}{R_9} \cdot \frac{KT}{q} \ln \frac{a \cdot R_8}{R_7} \qquad (13)$$

Substituting the formulas (4), (5) and (13) into the formula (3), $$V_{thf} = \left(1 + \frac{R_{10}}{R_{11}}\right) \left(V_{BEQ9} + V_{thQ8} + \frac{R_8}{R_9} \cdot \frac{KT}{q} \ln \frac{a \cdot R_8}{R_7}\right) \qquad (14)$$

When the voltage $V_f$ at the detection terminal 1 meets the condition of $V_f < V_{thf}$, the relationship of the $I_{Q6} < I_{Q7}$ is satisfied between currents $I_{Q6}$ and $I_{Q7}$ flowing through the transistors Q6 and Q7, with the result that the base-emitter voltage $V_{BEQ8}$ at the transistor Q8 is less than the threshold voltage $V_{thQ8}$ ($V_{BEQ8} < V_{thQ8}$). Hence, the transistor Q8 is cut off, and the output terminal 2 is opened. On the other hand, when the voltage $V_f$ at the detection terminal 1 is greater than or equal to $V_{thf}$, $I_{Q6}$ is greater than or equal to $I_{Q7}$, so that $V_{BEQ8}$ is greater than or equal to $V_{thQ8}$ ($V_{BEQ8} \geq V_{thQ8}$). Consequently, the transistor Q8 is conducting and the output terminal 2 is at a low level. Thus, it is possible to detect the input voltage $V_f$ applied to the terminal 1 by comparing it with the threshold voltage $V_{thf}$. The temperature coefficient of the threshold voltage $V_{thf}$ at the detection terminal 1 is expressed as follows:

$$\frac{\partial V_{thf}}{\partial T} = \left(1 + \frac{R_{10}}{R_{11}}\right) \left(\frac{\partial V_{BEQ9}}{\partial T} + \frac{\partial V_{thQ8}}{\partial T}\right) + \frac{R_8}{R_9} \cdot \frac{K}{q} \ln \frac{a \cdot R_8}{R_7} \qquad (15)$$

If appropriate values are selected for resistance ratios $R_8/R_9$ and $R_8/R_7$ as well as the emitter area ratio a of the transistor Q6 to the transistor Q7 in such a way that the following formula is obtained from the right side of the formula (15), $$\frac{R_8}{R_9} \cdot \frac{K}{q} \ln \frac{a \cdot R_8}{R_7} = -\left(\frac{\partial V_{BEQ9}}{\partial T} + \frac{\partial V_{thQ8}}{\partial T}\right), \qquad (16)$$

then it is possible to bring the temperature coefficient $\partial V_{thf}/\partial T$ of the threshold voltage $V_{thf}$ at the detection terminal 1 to zero. As a specific example, if selections are made as: $R_7 = R_8 = 29$ k$\Omega$, $R_9 = 1$ k$\Omega$, $a = 5$, $R_{10} = 4$ k$\Omega$, and $R_{11} = 8$ k$\Omega$, the $\partial V_{thf}/\partial T = 38$ $\mu$V/° K. due to the fact that both $\partial V_{BEQ9}/\partial T$ and $\partial V_{thQ8}/\partial T$ are approximately $-2$ mV/° K. Thus, the temperature coefficient becomes extremely small.

As described above, the threshold voltage $V_{thf}$ of the circuit shown in FIG. 2 is determined by the base-emitter voltage $V_{BEQ9}$ of the transistor Q9, the threshold voltage $V_{thQ8}$ of the transistor Q8, the voltage drop $V_{R8}$ across the resistor R8, and the resistance ratio of the resistors R10 to R11, and is independent of the power supply voltage. Accordingly, it is possible to detect the input voltage supplied to the detection terminal 1 regardless of the transient state of the power supply voltage or a considerable power supply voltage drop. Also, since the threshold voltage $V_{thf}$ is variable by adjusting the resistance ratio of the resistor R10 to the resistor R11, it is possible to adjust the detection level of the input voltage. Furthermore, since the temperature coefficient of the threshold voltage $V_{thf}$ is determined by negative temperature coefficients of the base-emitter voltage $V_{BEQ9}$ of the transistor Q9 and the threshold voltage $V_{thQ8}$ of the transistor Q8, and by a positive temperature coefficient of the voltage drop $V_{R8}$ of the resistor R8, the variation in the threshold voltage $V_{thf}$ caused by the ambient temperature change can be reduced. Hence, the variation in the detection level of the input voltage is suppressed. If the negative and positive temperature coefficients are made to be the same level, the threshold voltage $V_{thf}$ becomes substantially constant irrespective of the ambient temperature change.

The reason why the voltage drop $V_{R8}$ across the resistor R8 has a positive temperature coefficient is that the transistors Q6 and Q7 operate at different current densities. Since the resistor R9 is connected to the emitter of the transistor Q7, the transistors Q6 and Q7 operate at different current densities.

Figure 3:
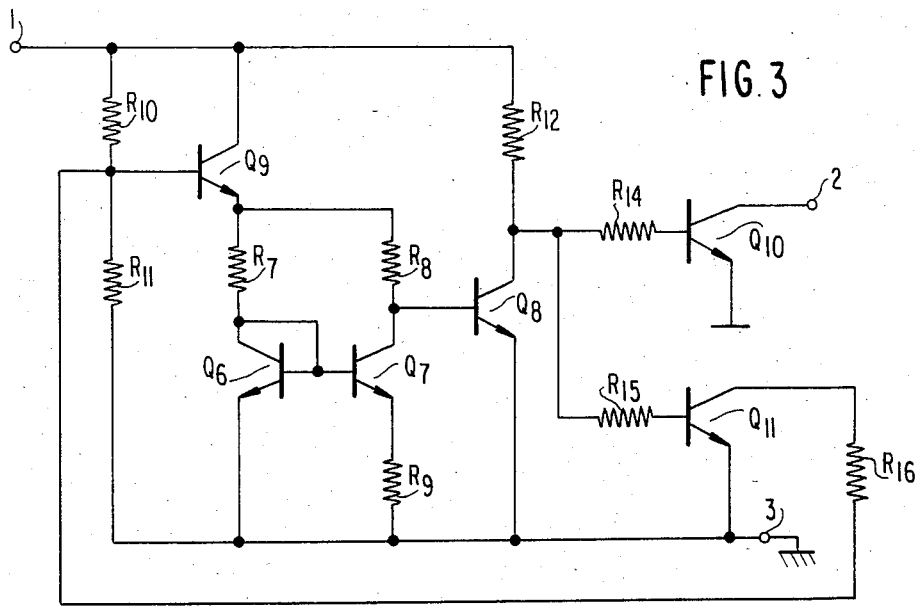
FIG. 3 is a circuit diagram of a voltage detection circuit in accordance with another preferred embodiment of the present invention.

FIG. 3 shows another preferred embodiment of the present invention. The circuit shown in FIG. 3 has a hysteresis characteristic as to an input voltage level at which the state of the output terminal 2 is inverted, to compensate the detection operation with respect to the noise included in the input voltage.

A detection circuit, which detects the input voltage to be detected by comparing the same with the threshold, performs a stable detection operation without being affected by the power supply voltage. Therefore, such a detection circuit is often used in detecting the state of the power supply voltage. More specifically, the power supply voltage falls in a transient state when the power is turned on or off. Accordingly, for instance, in an amplifier circuit, a switching regulator and other electronic circuits, noise signals are sometimes supplied to a load owing to the transient state of the power supply voltage. Hence, it is desirable to deactivate operations of such circuits or to cut the supply of signals to the load in a transient state such as during the turning on or off of the power. For this purpose, the detection circuit shown in FIG. 2 employs a voltage corresponding to the power supply voltage as the input voltage supplied to the terminal 1. In the detection circuit shown in FIG. 2, the voltage corresponding to the power supply voltage is compared with the threshold voltage $V_{thf}$ expressed by the formula (14), and the state of the output terminal 2 undergoes change according to their relationship of magnitude. The threshold voltage $V_{thf}$ can be established irrespective to the power supply voltage. Therefore, by establishing such a threshold $V_{thf}$ as would eliminate the transient state of the power supply voltage, the circuit of FIG. 2 utilizes an output signal from the terminal 2 to control the operations of the above circuits or to cut the supply of signals to the load.

In the detection circuit shown in FIG. 2, however, there is only one threshold $V_{thf}$ that would invert the state at the output terminal 2. Therefore, when the voltage such as the power supply voltage in the transient state is supplied, the state of the output signal at terminal 2 is inverted periodically due to large noise components. A voltage detection circuit that resolves this problem is shown in FIG. 3.

Turning back to FIG. 3, the same functional elements as those used in FIG. 2 are shown by the same references and their description will be omitted. In FIG. 3 the collector of the transistor $Q_8$ is not connected to the output terminal 2, but connected to the detection terminal 1 via a resistor 12. The collector of the transistor $Q_8$ is further connected to the bases of transistors $Q_{10}$ and $Q_{11}$ via resistors $R_{14}$ and $R_{15}$, respectively. The emitter of the transistor $Q_{10}$ is grounded, while its collector is connected to the output terminal 2. The emitter of the transistor $Q_{11}$ is connected to the terminal 3, while its collector is connected to the junction point between the resistors $R_{10}$ and $R_{11}$ via a resistor $R_{16}$.

In the circuit arrangement shown in FIG. 3, when the input voltage is smaller than the threshold, the transistor $Q_8$ is cut off to turn the transistors $Q_{10}$ and $Q_{11}$ on. Therefore, the output terminal 2 takes a low level. At this time, the resistor $R_{16}$ is grounded by the transistor $Q_{11}$. On the other hand, when the input voltage is greater than the threshold voltage, the transistor $Q_8$ is made to conduct, so that the transistors $Q_{10}$ and $Q_{11}$ are off. Hence the output terminal 2 is opened. Also, the resistor $R_{16}$ is opened.

In a circuit having such an arrangement, if the threshold voltage at the detection terminal 1 appearing when the transistor $Q_8$ is shifted to its conductive state from a cut-off state is taken as $V_{thf\text{-}1}$, and that appearing when the transistor $Q_8$ turns to a closed state from a conductive state as $V_{thf\text{-}2}$, then $V_{thf\text{-}1}$ and $V_{thf\text{-}2}$ can be expressed as follows:

$$V_{thf\text{-}1} = \left(1 + \frac{R_{10}}{R_{11}//R_{16}}\right) \cdot V_{BQ9} \quad (17)$$

$$V_{thf\text{-}2} = \left(1 + \frac{R_{10}}{R_{11}}\right) \cdot V_{BQ9} \quad (18)$$

where $R_{11}// R_{16}$; parallel resistance value of resistors $R_{11}$ and $R_{16}$ $V_{BQ9}$: base voltage at transistor $Q_9$ Here, the base voltage $V_{BQ9}$ at the transistor $Q_9$ is equal in respective cases, and can be given as follows from the formulas (4), (5) and (13).

$$V_{BQ9} = V_{BEQ9} + \frac{R_8}{R_9} \cdot \frac{KT}{q} \ln \frac{a \cdot R_8}{R_7} + V_{thQ8} \quad (19)$$

Therefore, if the hysteresis width is taken as $\Delta V_{thf}$, from the formulas (17) and (18) it is possible to establish:

$$-\Delta V_{thf} = V_{thf-1} - V_{thf-2} = \frac{R_{10}}{R_{16}} \times V_{BQ9} \quad (20)$$

Hence, this hysteresis characteristic becomes advantageous to such a voltage detection circuit that detects the power supply voltage having a transient phonemenon.

Also, with respect to the temperature coefficient of the threshold voltage at the detection terminal 1 in FIG. 3, it is possible to make it small by selecting appropriate values for resistance ratios $R_8/R_9$ and $R_8/R_7$ and the emitter area ratio of the transistor $Q_6$ to the transistor $Q_7$, as already mentioned in the preferred embodiment shown in FIG. 2.

In this embodiment, there is only one output terminal. However, a voltage detection circuit having a plurality of output terminals can be obtained by connecting a plurality of circuits having the same arrangement as that comprised of the resistor $R_{14}$ and the transistor $Q_{10}$ to the collector of the transistor $Q_8$ in parallel with the circuit of $R_{14}$ and $Q_{10}$ and with each other and coupling output terminals to collectors of the respective transistors.

1. A circuit comprising a first transistor of an emitter follower type supplied with an input voltage to be detected, a reference potential terminal, first and second current paths connected between an output end of said first transistor and said reference potential terminal and coupled in parallel to each other, said first current path having a second transistor, said second current path having a third transistor, said second and third transistors having bases coupled in common and operating at differential current densities, a fourth transistor coupled to said third transistor to receive a collector output of said third transistor, and output means coupled to said fourth transistor for deriving a detection output signal.

2. A circuit according to claim 1, wherein said second transistor is connected to form a diode, and said second current path further has a resistor connected between the output end of said first transistor and the collector of said third transistor, whereby said fourth transistor turns on in response to said input voltage having a voltage amplitude greater than the sum of a base-emitter voltage of said first transistor, the voltage drop across said resistor and the threshold voltage of said fourth transistor.

3. A circuit according to claim 4, further comprising first, second and third resistors, fifth and sixth transistors, and an input terminal, said first and second resistors being connected in series between said input terminal and said reference terminal, said input voltage being supplied to said first transistor through said first resistor from said input voltage, said fifth transistor coupled between said fourth transistor and said output means to receive a collector output of said fourth transistor, said sixth transistor receiving said collector output of said fourth transistor, said third resistor being connected to a collector of said sixth transistor and a connection point between said first and second resistors, whereby said circuit has a first level of said input voltage at which said fourth transistor turns on and a second level of said input voltage at which said fourth transistor turns off.

4. A circuit comprising a first terminal supplied with a voltage to be detected, a second terminal supplied with a reference potential, first and second resistors connected in series between said first and second terminals, a first transistor having an emitter, a base connected to a connection point between said first and second resistors, and a collector connected to said first terminal, a series connection of a third resistor and a second transistor of a diode-connected type between said emitter of said first transistor and said second terminal, a series connection of a fourth resistor, a third transistor and a fifth resistor between said emitter of said first transistor and said second terminal, bases of said second and third transistors being coupled in common, a fourth transistor having a collector, a base connected to the collector of said third transistor and an emitter connected to said second terminal, and a third terminal connected to said collector of said fourth transistor to derive a detection output signal.

5. A circuit comprising an input terminal supplied with a voltage to be detected, a reference potential terminal, first and second resistors connected in series between said input and reference potential terminals, a first transistor having a base connected to a connection point between said first and second resistors and a collector connected to said input terminal, a first series circuit of a third resistor and a second transistor of a diode-connection coupled between the emitter of said first transistor and said reference potential terminal, a second series circuit of a fourth resistor, a collector-emitter path of a third transistor and a fifth resistor coupled between the emitter of said first transistor and said reference potential terminal, said second transistor having a base coupled to a base of said third transistor, a fourth transistor having a base connected to the collector of said third transistor and an emitter connected to said reference potential terminal, a sixth resistor connected between a collector of said fourth transistor and said input terminal, a fifth transistor having a base coupled to the collector of said fourth transistor and an emitter connected to said reference potential terminal, a detection output terminal connected to a collector of said fifth transistor, a sixth transistor having a base coupled to the collector of said fourth transistor and an emitter connected to said reference potential terminal, and a seventh resistor connected between a collector of said sixth transistor and said connection point between said first and second resistors.

* * * * *

UNITED STATES PATENT AND TRADEMARK OFFICE
CERTIFICATE OF CORRECTION

PATENT NO. : 4,607,174

DATED : August 19, 1986

INVENTOR(S) : Masashi SHOJI et al

It is certified that error appears in the above-identified patent and that said Letters Patent is hereby corrected as shown below:

Column 2, Line 26, delete ";".

Column 3, Line 22, before "is", insert --as--.

Column 3, Line 41, before "the", insert --at--.

Column 5, Line 55, delete "the", and insert therefor --then--.

Signed and Sealed this

Tenth Day of February, 1987

*Attest:*

DONALD J. QUIGG

*Attesting Officer*  *Commissioner of Patents and Trademarks*